United States Patent [19]

Grabbe

[11] Patent Number: 4,957,800

[45] Date of Patent: Sep. 18, 1990

[54] METHOD OF CONSTRUCTING A MONOLITHIC BLOCK HAVING AN INTERNAL GEOMETRY AND THE BLOCK RESULTING THEREFROM

[75] Inventor: Dimitry G. Grabbe, Middletown, Pa.

[73] Assignee: AMP Incorporated, Harrisburg, Pa.

[21] Appl. No.: 372,406

[22] Filed: Jun. 27, 1989

[51] Int. Cl.⁵ .............................. B32B 3/10; C09J 5/02
[52] U.S. Cl. ..................... 428/136; 156/252; 156/278; 156/307.5; 439/65; 439/74; 439/883
[58] Field of Search ............... 156/307.5, 278, 252; 428/136; 439/65, 883, 74; 29/830

[56] References Cited

U.S. PATENT DOCUMENTS

| | | | |
|---|---|---|---|
| 2,992,954 | 7/1961 | Nelson et al. | 156/278 |
| 3,271,726 | 9/1966 | Pfendler | 29/830 |
| 4,076,869 | 2/1978 | Flynn | 427/386 |

Primary Examiner—John J. Gallagher

[57] ABSTRACT

A method of constructing a connector housing block which includes a plurality of chambers (16) each for holding a contact member (14) therein, wherein the block is constructed of a plurality of stacked plates (18). Each of the plates (18) is formed with a plurality of apertures (20) so situated on the plates (18) that when the plates (18) are stacked the apertures (20) form the plurality of chambers (16). A solution of resin and catalyst in a solvent is provided, the plates (18) are coated with the solution, and the solvent is allowed to evaporate from the plates (18) to leave a continuous film of B-Staged resin and catalyst on the plates (18) which does not fill the apertures (20). The plates (18) are then stacked and the resin and catalyst are caused to crosslink and fuse.

10 Claims, 2 Drawing Sheets 4,957,800

METHOD OF CONSTRUCTING A MONOLITHIC BLOCK HAVING AN INTERNAL GEOMETRY AND THE BLOCK RESULTING THEREFROM

BACKGROUND OF THE INVENTION

This invention relates to monolithic blocks having an internal geometry and, more particularly, to a method of constructing such a block (wherein the small size of the internal geometry is unsuitable for conventional molding technology.)

There are situations where it is desired to produce a monolithic block having an internal geometry which is so small that the fine features thereof cannot be produced through conventional molding technology. For example, in my co-pending U.S. patent application Ser. No. 07/337,730, filed Apr. 13, 1989, and assigned to the assignee of this invention, now U.S. Pat. No. 4,906,194, I disclose a high density connector assembly for an integrated circuit chip carrier which includes a stack of metallic plates having apertures which form chambers for holding planar contact members therein. These plates are relatively thin, illustratively having a thickness of 0.010 inch, and a typical aperture is a rectangular slot 0.0055 inch by 0.080 inch. There are many of these apertures, illustratively equally spaced on 0.0150 inch centerlines. The plates are then stacked in alignment to form a block structure, with the stacked apertures forming a plurality of chambers, each of which can accommodate therein a planar contact member. To insulate the plates from the contact members, the plates are coated with an insulating layer of dielectric material. The stack of plates provides a ground shield and return path around each of the contact members to prevent cross-talk therebetween. Preferably, the plates are made of aluminum which is subsequently anodized or otherwise oxidized to provide a relatively thick layer of oxide on all surfaces of the plates.

Although disclosed in connection with a contact socket for a connector assembly, the aforedescribed technique of providing a stack of thin sheets, each with an appropriate geometry representing the dimensions which one would obtain by cross-sectioning a three-dimensional structure in a given plane, has more general application. This technique may be used whenever the fine features of the internal geometry of a desired monolithic block are so small that the traditional technology of molding plastic becomes inadequate due to a limitation of the space between core pins in the mold into which the plastic will flow, provide an adequate packing density, and retain at least some mechanical strength when extracted from the mold.

However, it has been discovered that such structures present an environmental problem in actual use, because the plates stacked together in close proximity, and even under pressure, will have a capillary interface between their surfaces. Such capillary interface will trap and hold moisture. In the case of water in liquid form, the holding is accomplished by surface tension. In the case of vapors or very thin film, the holding is accomplished by osmotic pressure.

In an (electrical connector,) entrapped moisture is detrimental because it can be a medium for ion transport, thereby providing an electrolytic path between contacts, which may have a difference of potential in relation to each other. This will result in a leakage path being provided between the contacts which can possibly result in corrosion and an ultimate failure of the connector assembly. Furthermore, if the plates are made of anodized aluminum, there is the additional problem of porosity which is, if not inherent, at least typical in an aluminum oxide coating. The sealing of such pores has traditionally been accomplished by vacuum impregnation or coating with organic fillers. However, this still leaves the capillary interface.

It is therefore an object of this invention to provide a method for eliminating capillary interfaces and pores between adjacent plates in a stack of plates forming a block having an internal geometry.

SUMMARY OF THE INVENTION

The foregoing and additional objects are attained in accordance with the principles of this invention by providing a method of constructing a monolithic block having an internal geometry. The block is formed by a plurality of relatively thin plates each with an appropriate geometry that when the plates are stacked in the proper sequence the internal geometry is replicated. (A solution of resin and catalyst in a solvent is used to coat the plates. The solvent is then allowed to evaporate from the plates to leave on each plate a continuous thin film of resin and catalyst which does not fill any openings in the plate. This film has a thickness of about 0.0002 inch. The plates are stacked and the resin and catalyst are then cross-linked and fused.)

BRIEF DESCRIPTION OF THE DRAWINGS

The foregoing will be more readily apparent upon reading the following description in conjunction with the drawings in which like elements in different figures thereof have the same reference numeral and wherein.

DETAILED DESCRIPTION

Figure 1:
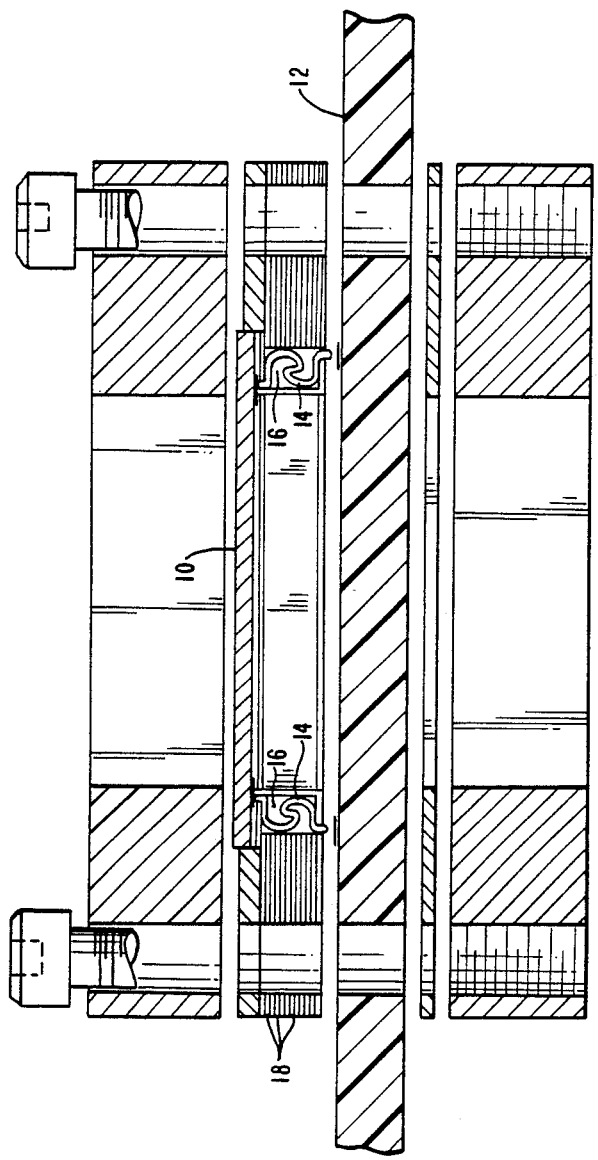
FIG. 1 is a semi-exploded cross-sectional view through the connector assembly of the aforereferenced copending application, useful for illustrating an application of the present invention.

FIG. 1 illustrates the connector assembly disclosed in the aforereferenced co-pending patent application, and only as much structure as is necessary for understanding the present invention will be described herein. Thus, the connector assembly shown in FIG. 1 functions to connect a pattern of contact pads on an integrated circuit chip carrier, or module, 10 to a pattern of corresponding contact pads on a printed circuit board 12. Connection between the contact pads is made by a plurality of contact members 14 which are positioned in chambers 16 formed by aligned apertures in a stack of spacer plates 18.

Figure 2:
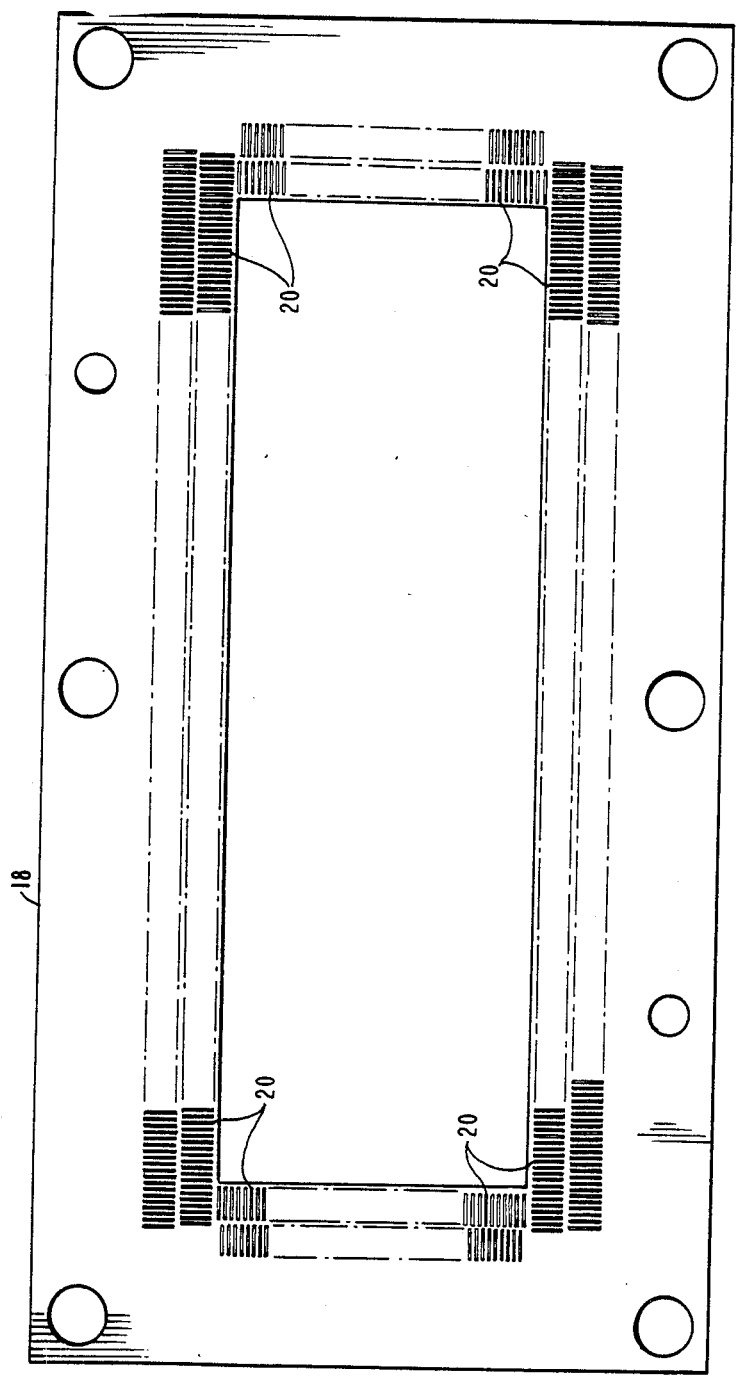
FIG. 2 is a plan view of a typical spacer plate of the assembly of FIG. 1.

FIG. 2 shows an illustrative spacer plate 18 which has a plurality of apertures 20 in an orderly array. The apertures 20 are typically rectangular, having typical dimensions of 0.0055 inch by 0.080 inch, and are equally spaced on 0.0150 inch centerlines. It will therefore be appreciated that the separation between adjacent apertures 20 is 0.0095 inch. Apertures of that size with that spacing therebetween cannot be molded using conventional molding techniques. Accordingly, (the plates 18 are formed of metal.) Preferably, the plates 18 are formed of aluminum which is subsequently anodized, or otherwise oxidized, to provide a relatively thick, abrasion resistant dielectric layer. (The problem sought to be alleviated occurs when the plates 18 are stacked into the assembly shown in FIG. 1, where the aligned and stacked apertures 20 form the chambers 16. The capillary interface between adjacent surfaces of the plates 18 allows moisture to be trapped. Accordingly, what is needed is a method by which the stack of plates can be sealed to totally fill the capillaries while at the same time preventing the sealing material from migrating into the apertures 20 to occupy space which is reserved for the contact members 14.)

In accordance with this invention, a suitable resin and catalyst, such as for example, Hysol Novolac epoxy, in appropriate proportions are dissolved in a solvent, for example, methyl ethyl ketone (MEK), acetone, toluene, or the like. In such a solution, the molecules of both the resin and the catalyst are dispersed, and no cross-linking takes place. The resulting solution is then placed in a suitable container and the plates 18 are immersed individually into the solution and then withdrawn. The wet plates 18 are then allowed to dry, with the solvent evaporating therefrom. This leaves a film of resin and catalyst on each of the plates 18.

By choosing a correct ratio of the resin and catalyst to solvent, as the solvent evaporates, a continuous "B-Staged" film of resin and catalyst remains on all the surfaces of the plates 18. As is well known, a B-Staged film of resin and catalyst is one in which the resin and catalyst have not reacted together in a cross-linking fashion. Such a film is extremely thin. Preferably, the ratio of the resin and catalyst to solvent is chosen so that evaporation of the solvent from the coated plates 18 leaves a film of resin and catalyst on each of the plates 18 that is approximately 0.0002 inch thick. This ratio must be experimentally determined for each batch of resin since different batches have different average molecular chain lengths which changes the viscosity of the batches. Care must be taken to prevent the film from becoming too thick, because if the film is too thick it can block the apertures 20. An illustrative experimental method for determining a suitable ratio comprises the following steps:

1. A measured amount of resin and catalyst is placed in a container.
2. A measured amount of solvent is added to the resin in the container.
3. The contents of the container are thoroughly mixed.
4. The thickness of a test piece, such as a plate or rod, is measured.
5. The test piece is dipped into the solution in the container.
6. The test piece is removed from the container and the solvent is allowed to evaporate. This takes place in a few seconds.
7. The thickness of the coated test piece is measured to determine the film thickness.
8. If the film thickness is too great, more solvent is added to the container and the preceding steps are repeated until a satisfactory film thickness is obtained. Since the amounts of resin and solvent to obtain the desired film thickness is known for that particular batch of resin, subsequent mixtures with the appropriate ratio can be made.
9. If the film on the coated test piece is too thin, a portion of the solvent is allowed to evaporate, and the testing is repeated. The criteria for determining if the film is too thin is that the test piece is not completely coated. A requirement is that the film be continuous on the test piece, so that it is continuous on the plates 18.

The coated plates 18 are then stacked in correct numbers, sequence, and alignment to each other in a fixture, where they are subjected to pressure and heat to permit the B-Staged material to cross-link and fuse, converting the stack into a monolithic structure. The pressure applied to the stack of plates 18 must be sufficient to bring adjacent surfaces of the plates into intimate mutual contact so that substantially all voids between the plates are filled with the resin and catalyst film. The heat is for the purpose of cross-linking the resin, which is of a type that doesn't cross-link at room temperature. Depending upon the resin used, the temperature required for cross-linking ranges from about 250° F. to about 450° F. In the case of Hysol Novolac epoxy, a temperature of approximately 350° F. has been found to be suitable. The aforedescribed method accomplishes two functions simultaneously. The first function is the filling and sealing of the pores in the cases in which the stack is made of oxidized aluminum plates and also providing a filler of the capillaries between the plates. The second function is the mechanical fusion of the plates to create a monolithic block structure. Accordingly, there has been disclosed an improved method of constructing a monolithic block having an internal geometry. While a preferred embodiment has been disclosed, it will be apparent to those skilled in the art that various modifications to the disclosed embodiment may be made and it is only intended that the scope of this invention be limited by the appended claims.

I claim:

1. A method of constructing a connector block, said block including a plurality of chambers each for holding a contact member therein, comprising the steps of:

providing a plurality of metal plates, each of said plates being formed with a plurality of apertures so situated on said plates that when said plates are stacked the apertures form said plurality of chambers;

providing a solution of resin and catalyst in a solvent;

coating each of said plates with said solution;

allowing said solvent to evaporate from each of said plates to leave a film of resin and catalyst thereon;

stacking said plates; and causing the resin and catalyst to cross-link and fuse;

wherein the step of providing a solution of resin and catalyst in a solvent comprises choosing a ratio of resin and catalyst to solvent so that when said solvent evaporates from each of said plates there remains on each of said plates a continuous film of resin and catalyst approximately 0.0002 inch thick, so that said film does not fill any of said apertures in each of said plates.

2. A method according to claim 1 wherein the step of causing the resin and catalyst to cross-link and fuse includes the resin of applying pressure to the stacked plates sufficient to bring adjacent surfaces of the plates into intimate mutual contact so that substantially all voids therebetween are filled with resin and catalyst.

3. A method according to claim 2 further including the step of heating the stacked plates sufficient to cause cross-linking of the resin and catalyst.

4. A method according to claim 1 wherein the step of coating each of said plates includes:

placing said solution in a container;

immersing each of said plates in the solution in said container; and removing each of said plates from said solution.

5. A connector socket block comprising a plurality of chambers each for holding a contact member therein, whenever constructed by the method of claim 1.

6. A method of constructing a monolithic block having an internal geometry, comprising the steps of:
   providing a plurality of relatively thin metal plates each with an appropriate geometry that when stacked together in proper sequence said internal geometry is replicated;
   providing a solution of resin and catalyst in a solvent;
   coating each of said plates with said solution;
   allowing said solvent to evaporate from each of said plates to leave a film of resin and catalyst thereon;
   stacking said plates; and
   causing the resin and catalyst to cross-link and fuse;
   wherein the step of providing a solution of resin and catalyst in a solvent comprises choosing a ratio of resin and catalyst to solvent so that when said solvent evaporates form each of said plates there remains on each of said plates a continuous film of resin and catalyst approximately 0.0002 inch thick, so that said film does not fill any apertures which may be in each of said plates.

7. A method according to claim 1 wherein the step of causing the resin and catalyst to cross-link and fuse includes the step of applying pressure to the stacked plates sufficient to bring adjacent surfaces of the plates into intimate mutual contact so that substantially all voids therebetween are filled with resin and catalyst.

8. A method according to claim 7 further including the step of heating the stacked plates sufficient to cause cross-linking of the resin and catalyst.

9. A method according to claim 7 wherein the step of coating each of said plates includes:
   placing said solution in a container;
   immersing each of said plates in the solution in said container; and
   removing each of said plates from said solution.

10. A monolithic block having an internal geometry, whenever constructed by the method of claim 7.

* * * * *